(12) United States Patent
Balistreri et al.

(10) Patent No.: US 6,259,327 B1
(45) Date of Patent: Jul. 10, 2001

(54) PLL HAVING CIRCUITS FOR SELECTING OPTIMUM VCO INPUT/OUTPUT CHARACTERISTICS

(75) Inventors: Emanuele Balistreri, Battipaglia; Marco Burzio, Grugliasco, both of (IT)

(73) Assignee: CSELT - Centro Studi e Laboratori Telecomunicazioni S.p.A., Turin (IT)

( * ) Notice: Subject to any disclaimer, the term of this patent is extended or adjusted under 35 U.S.C. 154(b) by 0 days.

(21) Appl. No.: 09/439,959

(22) Filed: Nov. 12, 1999

(30) Foreign Application Priority Data

Dec. 11, 1998 (IT) .............................. TO98A1035

(51) Int. Cl.[7] .................................. H03L 7/099
(52) U.S. Cl. ................ 331/11; 331/17; 331/34; 331/57
(58) Field of Search ................ 331/10, 11, 17, 331/34, 57

(56) References Cited

U.S. PATENT DOCUMENTS 5,075,640  12/1991  Miyazawa ........................... 331/10
6,127,896 * 10/2000  Burzio ................................. 331/17

FOREIGN PATENT DOCUMENTS 0 915 568-A2 * 5/1999 (EP) .

* cited by examiner

*Primary Examiner*—Siegfried H. Grimm
(74) *Attorney, Agent, or Firm*—Herbert Dubno

(57) ABSTRACT

A phase locked loop circuit includes an input comparator (2) capable of generating a deviation signal which can be used for driving an oscillator (5) so as to generate an output signal (CLKOUT) locked to the input signal. The oscillator (5) can operate according to a plurality of characteristics under the control of a control circuit (8) including searching circuits arranged to carry out a first search phase by scanning the family of characteristics admitted for the operation of the oscillator (5) by bands of progressively reduced width, according to a general, dichotomic procedure. Upon completion of this first search phase, additional circuits of fine search are destined to identify the optimum operating point, compensating possible fluctuations of the characteristics.

12 Claims, 5 Drawing Sheets

PLL HAVING CIRCUITS FOR SELECTING OPTIMUM VCO INPUT/OUTPUT CHARACTERISTICS

Figure 1:
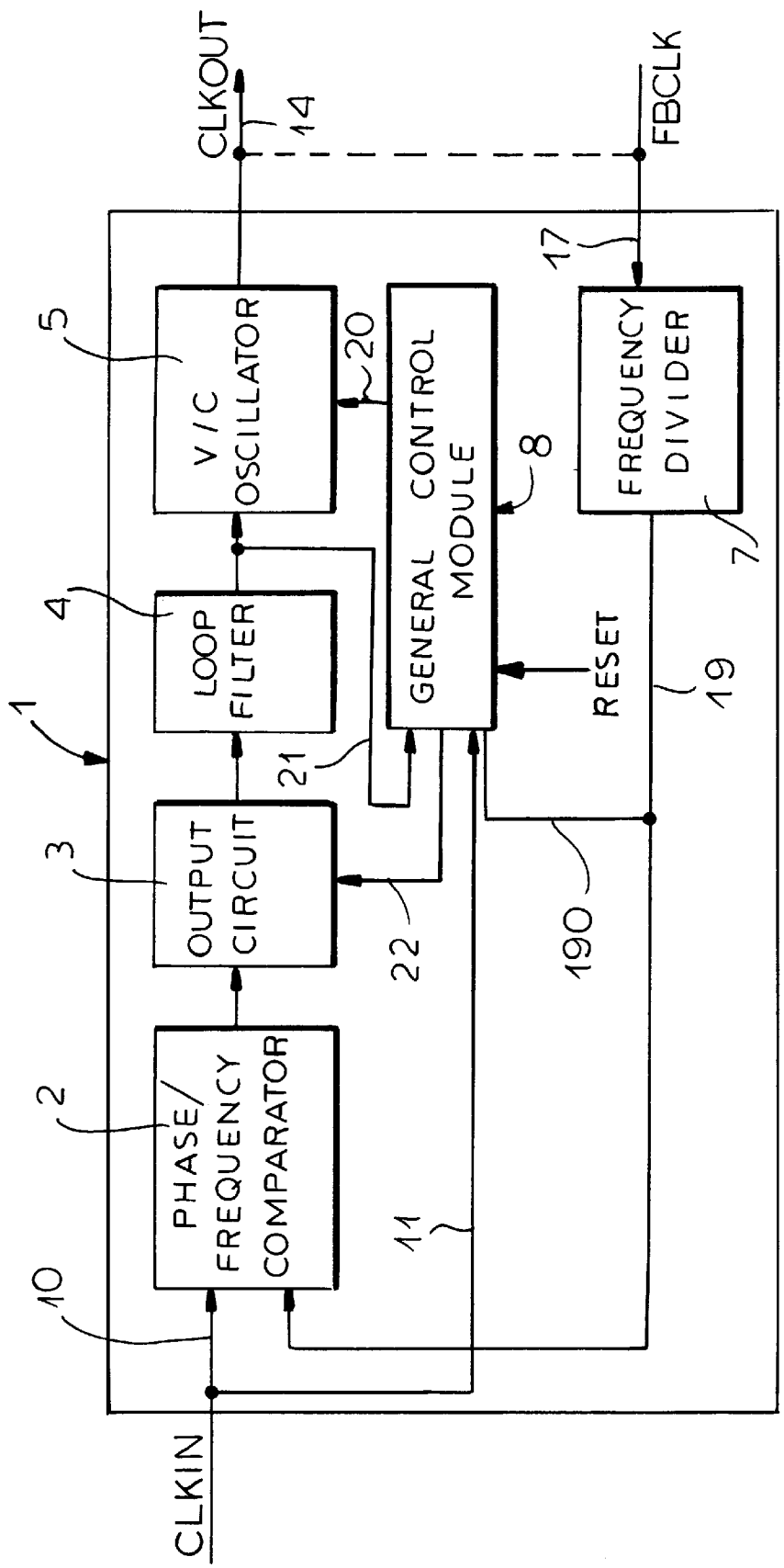

This invention relates to phase locked loops (PLL) and, more particularly, to phase locked loops arranged to operate according to a plurality of characteristics.

A PLL of this kind is described in European patent application EP-A 0 915 568, in the name of the applicant.

The phase locked loop of the above cited application comprises a comparator capable of generating, starting from an input signal and from a feedback signal, a deviation signal, as well as a loop filter fed with said deviation signal. Further, an oscillator is provided for generating, starting from at least one driving signal derived from the deviation signal, filtered by the loop filter, an output signal locked with the input signal. The oscillator can operate according to a plurality of characteristics that relate the driving signal with the output signal. Control means are provided within the circuit to originate said plurality of characteristics and to control automatically and selectively the operation of the oscillator, according to a characteristic that is selectively determined among the above mentioned plurality.

This invention has been conceived with the main purpose of improving the characteristics of flexibility and reliability of operation of such a circuit, in particular as far as the possibility is concerned of making the oscillator (and therefore the phase locked loop as a whole) operate not only at a predetermined frequency, but in a sufficiently wide frequency range. To explain the basic ideas, reference can be made, by way of an example, to a range between 100 MHz and 2 GHz. It is however evident that the reference to said values does in no way limit the scope of the invention.

To meet such a requirement, it is however necessary to take various factors into account.

First, the oscillator, usually a VCO (voltage-controlled oscillator), is a device with a wide output (oscillation frequency) range associated to a small input (control voltage) range.

Having a wide range of tunability is an advantage in terms of flexibility of use and increased possibility of application, but it is a critical and destabilising factor if the small input range is taken into account. As a matter of fact, the control voltage range cannot exceed the power supply voltage of the device (for example 2 V), what, in the event of an oscillator capable of covering for example the above cited frequency range, requires a sensitivity higher than 1 GHz/V. Such a sensitivity of the device makes the implementation of the device extremely critical, since any disturbance, albeit small, causes a considerable disturbance in the output frequency. Further it must be noted that under standard operating conditions, the system locks to the frequency of interest and makes use of the control voltage to keep the locking. The extent of the relating corrections is usually small with regard to the voltage that sets the nominal frequency. Therefore there is the risk of having a device which exploits a considerable part of its input range for determining the nominal frequency, while making instead use of a minimum part of such range for the standard tracking function.

The need of operating selectively at frequencies within a wide variation range makes then the circuit intrinsically more sensitive to the variations of the operating characteristics of the oscillator, in particular variations depending on the fabrication process of the circuit, which typically will be manufactured as an integrated circuit.

At the same time there is the aim of keeping low the sensitivity or gain of the oscillator so as to reduce consequently the cut off frequency of the transfer function of the phase of the PLL (with a consequent reduction of the noise effects): indeed it is impossible—due to the well known phenomena relating to the integration process of the circuit—to reach particularly high values for the capacity corresponding to the behaviour of the loop filter.

Lastly, in trying to meet the various needs described above by increasing the number of possible operating characteristics of the oscillator, the following issues must be taken into account:

the convergence process of the oscillator (thus of the phase locked loop circuit) towards the optimum operating point must be sufficiently fast and, at the same time, the circuit must exhibit a certain immunity against phenomena leading it to depart from the operating point attained through the initial convergence process.

According to the invention, said aim is achieved by virtue of a circuit that has the characteristics recalled in the following claims.

A tuneable PLL capable of operating according to a plurality of characteristics is disclosed in U.S. Pat. No. 5,075,640. There, the different characteristics correspond to different operating frequencies and are obtained by varying the length of the delay line of the oscillator. No provision is made for choosing an operating characteristic among a plurality of characteristics while keeping the operating frequency constant.

Obviously, even if the introductory part of this description and the subsequent detailed description of an exemplary embodiment of the invention make reference to a PLL destined to be manufactured in the form of an integrated circuit, the scope of the invention must in no way be considered limited to such specific context. In practice, the invention finds application in all the situations in which the previously mentioned problems occur either individually or in combination. This holds true in particular as far as the manufacture of the oscillator is concerned.

Figure 2:
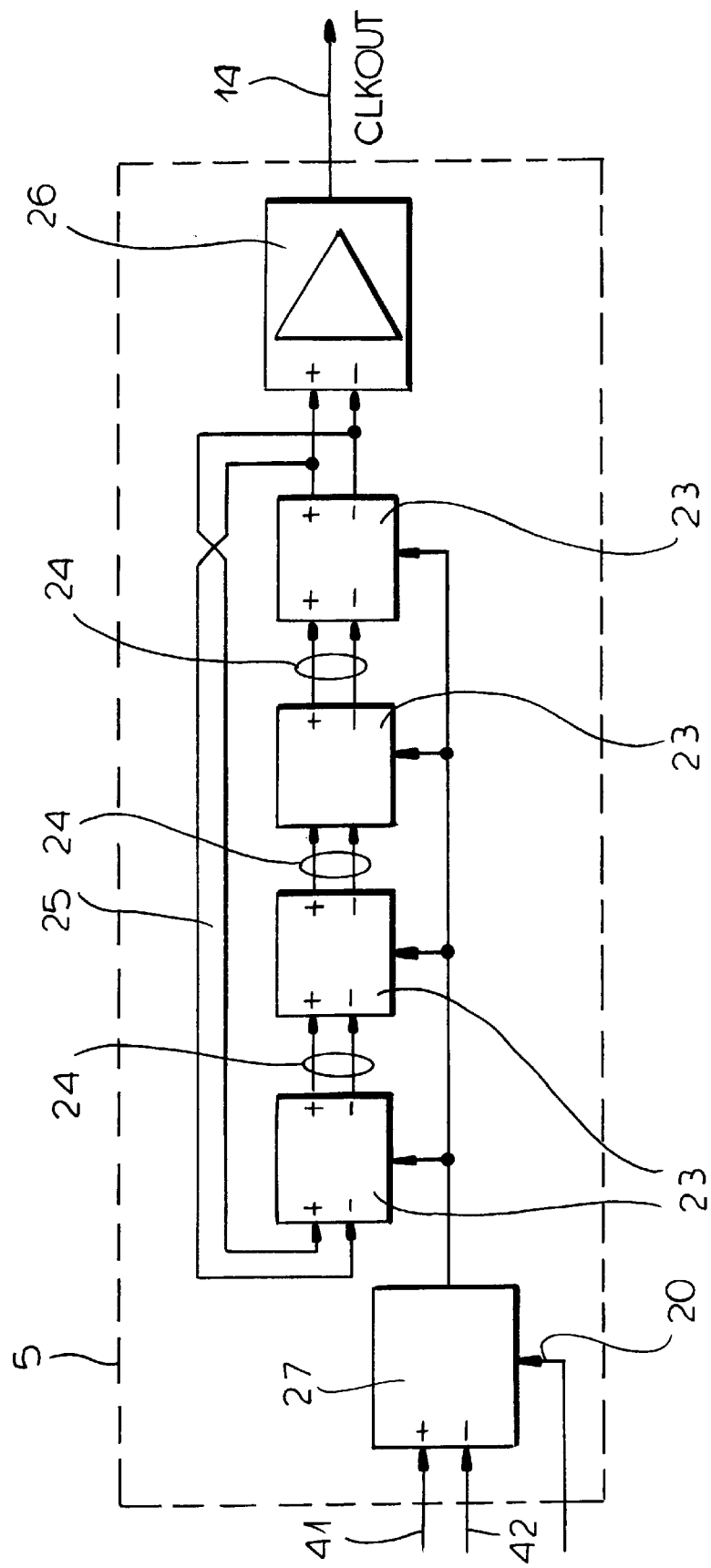
Figure 3:
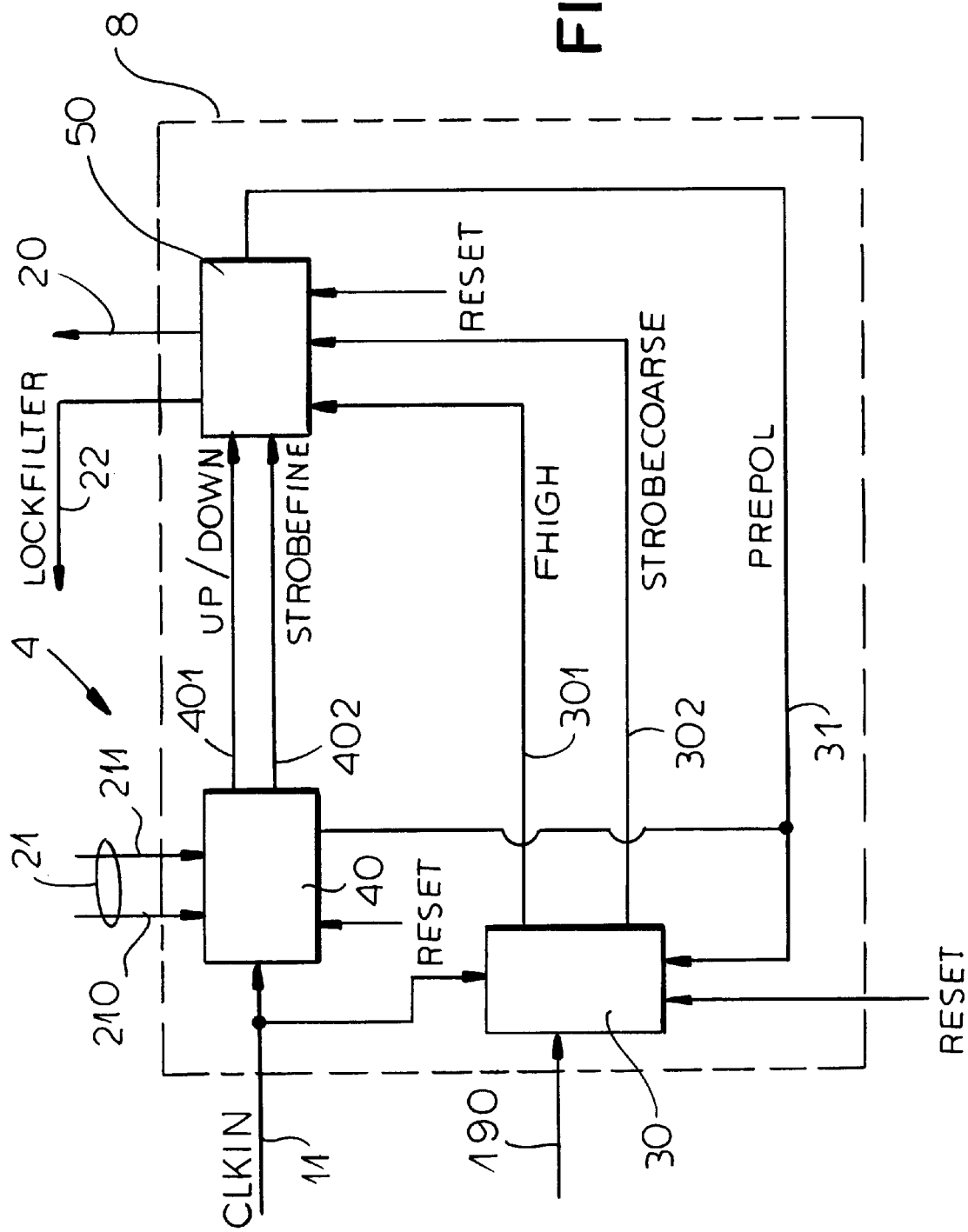
Figure 4:
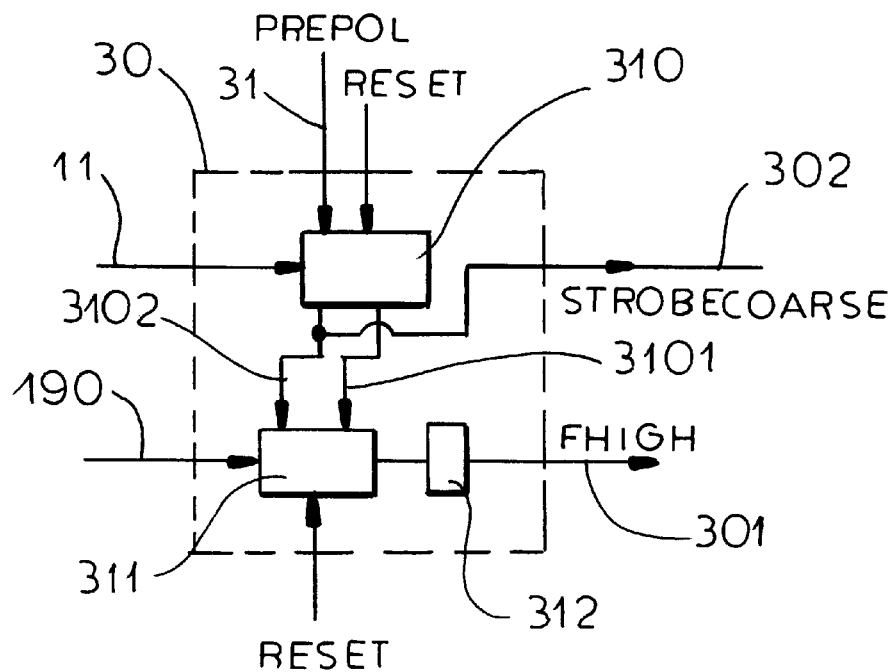
Figure 6:
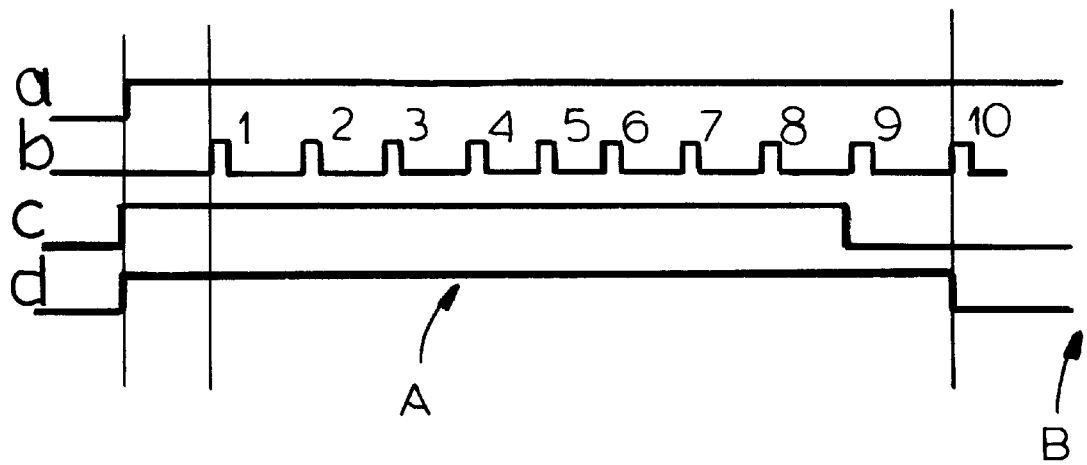
Figure 5:
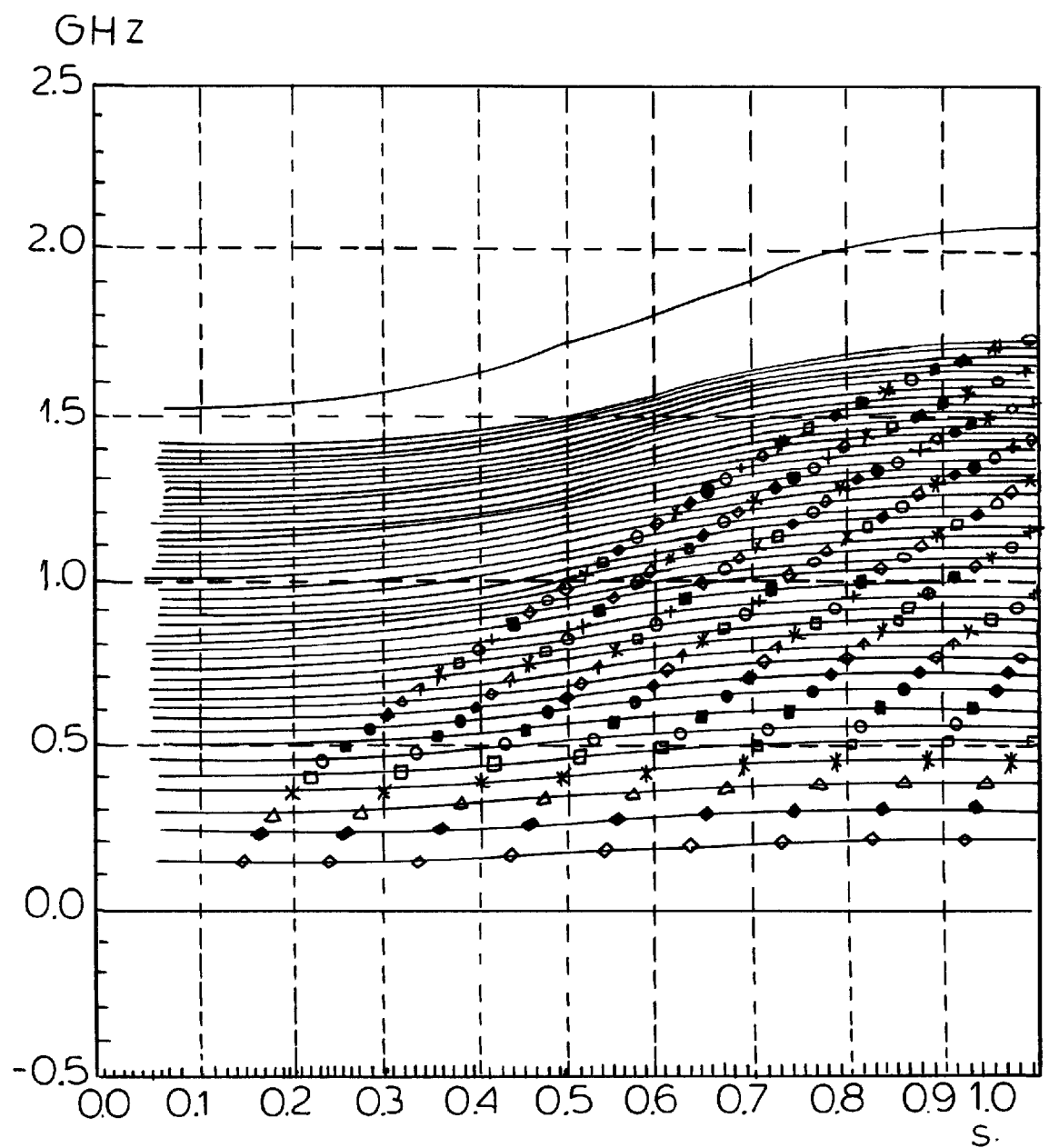

The invention shall now be described purely by way of a non-limiting example, with reference to the accompanying drawings, wherein:

FIG. 1 shows in the form of a general block diagram the structure of a PLL according to the invention, FIGS. 2 and 3 shows in greater detail a possible structure of two elements of the circuit of FIG. 1, FIG. 4 shows the structure of an element shown in FIG. 3, FIG. 5 is a diagram representing possible operating characteristics of the element shown in FIG. 2, and FIG. 6, which comprises four time diagrams denoted 6a to 6d, shows in detail the operation of the circuit elements shown in FIGS. 3 and 4.

In the block diagram of FIG. 1, the reference 1 denotes as a whole a PLL that, according to a configuration known per se, comprises the following elements or modules:

a phase/frequency comparator 2 having associated, as an output circuit, a circuit 3 of the type commonly called "current pump", a loop filter 4 that receives the output signal of the current pump 3, an oscillator 5, configured as a VCO (voltage-controlled oscillator) and driven by the output signal of the loop filter 4, a frequency divider 7, possibly inserted into the feedback loop of the circuit for the synthesis function (if required), and a general control module 8, destined to allow the reconfiguration of the circuit according to the modalities better described hereafter.

As to the divider 7, it must be recalled that the same may operate with both a division factor greater than 1 and—in a few applications—a division factor smaller than 1, thus acting in practice as a multiplier.

The references 20, 21 and 22 show on the whole the lines through which the control module 8 interacts, according to modalities better described in the sequel, with the oscillator 5, the filter 4 and the circuit 3.

Reference CLKIN indicates the signal for which the phase lock and/or the frequency lock and multiplication functions must be carried out according to the exemplary embodiment described herein.

Hereinafter, the signal CLKIN has been assumed to be essentially a clock signal with a given frequency. The solution according to the invention is nevertheless suitable for application also in situations in which the input signal of the block 2 is a data signal for which a clock recovery function is desired. In such a case the "given frequency" that is mentioned in the claims attached hereto obviously is the bit rate of the above-cited data signal. In such event, line 11 will convey in any case a clock signal, such as CLKIN.

The signal CLKIN is led over a line 10 to the input of the comparator 2 and, over a line 11, to one of the inputs of the control module 8. The latter also receives, over the line 21, a signal corresponding to the output of the comparator 2, in particular the output signal from the loop filter 4. This choice must however not be considered as mandatory: a substantially similar function might be driven, for example, starting from the output of the current pump 3. In any case, the driving starting from the output of the loop filter 4 proves advantageous since it benefits from the filtering action performed by filter 4 itself.

The output signal CLKOUT of the oscillator 5 constitutes the output signal of the circuit and is present on a line 14. The same signal can also be sent to a divider (not shown here for simplicity) which derives therefrom a frequency-divided output signal.

A feedback signal FBCLK, present on a line 17, is fed back towards the comparator 2 through the divider 7 and a line 19. As is easily understood by the person skilled in the art, the accessibility of the line 17 from outside the circuit 1 is destined to allow a greater flexibility in closing the feedback loop. The feedback action towards comparator 2 can therefore be effected both starting from the output signal CLKOUT present on the line 14 as well as from any other element located downstream of the line 14, for instance starting from the frequency-divided output signal. In the remainder of the present description it may be however imagined that the feedback line 17 is directly connected to the output line 14, as schematically shown in the FIG. 1 with a dashed line.

A preferred characteristic of the circuit 1 (characteristic that is not shown for simplicity in the general diagram of FIG. 1, but that can in any case be deduced, for instance, from FIGS. 2 and 3 relating to the structure of individual components) is the use of a differential structure, at least for the current pump 3, the loop filter 4 and the oscillator 5. The term differential (or balanced) structure indicates in general a structure wherein the signal transferred from one element to the other is actually formed by the difference of the signal value (typically a voltage value) present on two complementary lines, respectively positive or negative (or inverting).

This choice offers among other things the advantage of achieving a lesser sensitivity to noise, in particular to the noise on power supply, giving also rise to a lesser generation of disturbances (it is in fact possible to work with smaller and complementary signals with circuits that operate in a linear region).

The diagram in FIG. 2 shows in greater detail the structure of the oscillator 5, implemented according to the typical configuration of the ring oscillator. The structure, which is known per se, comprises in the exemplary embodiment shown four delay elements or stages 23, connected in cascade. The drawing clearly shows the complementary structure of the respective connecting lines 24 as well as of the feedback line 25 which connects (in an inverting manner, i.e. by creating a negative feedback) the output of the last delay element 23 with the input of the first element.

The reference 26 indicates an output buffer which acts on the output signals of the element 23 farthest downstream, thereby making them suitable for being sent over the line 14.

The reference 27 indicates a control circuit that receives at its input (preferably in a complementary configuration, on two lines denoted by 41 and 42 respectively) the output signal of the loop filter 4. The circuit 27 further receives, as configuration control signals, the signals incoming on the line 20. The oscillator diagram shown in FIG. 2 provides for the frequency control to be effected by varying the output impedance of the individual stage (or element) 23, also aiming at obtaining a constant voltage range at the output of the individual stage.

The control module 8 acts on the module 27 in such a way that the VCO operates according to one among several frequency/voltage characteristics, as schematically shown in the diagram of FIG. 5.

This Figure depicts the possible behaviours of the frequency/voltage characteristic of the oscillator 5.

In particular, in an exemplary embodiment tested in a fully satisfactory way, 256 characteristics were present (i.e. $2^n$ with n=8, but the number of the characteristics may ideally be any number, thus also different from a power of two). Each characteristic corresponds to a different driving configuration of the oscillator 5 by the circuit 27, i.e. to a given number of different behaviours of the output frequency versus the control signal received from module 8. The availability of such a wide family of characteristics allows covering a very wide range of possible variations of the operating frequency of the oscillator while keeping low the oscillator gain. The latter parameter determines the frequency range of the individual characteristic. The coverage of a wide range of operating frequencies is instead achieved just by virtue of the large number of available characteristics.

For the sake of clarity, it must be noted that in FIG. 5 only a part of the above characteristics has been shown: their density is in fact so high as to make impossible the complete reproduction in the scale of FIG. 5.

The behaviour of the characteristics represented is not constant and may be affected by different factors, such as ambient temperature, possible variations of the power supply voltage or different results of the technological process of fabrication of the circuit as an integrated circuit. For instance, the person skilled in the art often distinguishes between "fast" process parameters and "slow" process parameters, since the variability of the technological process results in practice in a higher or lower operating speed of the component.

The above variability factors affect the requirement of making the circuit according to the invention operate in a wide tuning range (see by way of example the range indicated in the introductory part of this description).

The provision of an oscillator 5 arranged to operate according to a frequency/voltage characteristic selectively identified in a very dense family of available characteristics (256 for the exemplary embodiment shown here) allows optimising the operation of circuit by adapting the behaviour of the oscillator 5 to the specific operating conditions. In particular, the fact that the characteristics of the family depicted in FIG. 5 have in their intermediate region an angular coefficient which increases when moving upwards along the family, allows implementing an adaptation function whose practical consequence is that of keeping limited and substantially constant the sensitivity of oscillator 5 (in terms of gain/actual operating frequency ratio) as the parameters vary, in particular with an adjustment action that has the characteristics of an automatic adaptation function.

EP-A 0 915568 describes the possible implementation of an automatic tracking of the optimum characteristic followed by a permanence on such a characteristic, in such a way as to prevent or at least to render very unlikely (unless the operating conditions of the device substantially change) subsequent changes of characteristic. In the exemplary embodiment described in the previous application the tracking of the optimum characteristic is performed starting from an initial point (usually corresponding to the circuit activation) positioned below the diagram of the characteristics (for this purpose reference may be made to the diagram of FIG. 5 of the present application) and then proceeding to the attainment of the optimum operating point through subsequent steps or jumps between adjacent characteristics. This solution is satisfactory as long as the number of the characteristics potentially to be examined is kept low (for example, up to 8 characteristics). When the number of the characteristics increases (reaching, for instance, 256, as in the example described here), the search for the optimum working point through subsequent jumps between adjacent characteristics may be penalising in terms of rapidity in attaining the optimum operating conditions of the device.

For this reason in the solution according to the invention it is envisaged that the achievement of the optimum operating conditions may occur in two subsequent stages or phases.

The first phase may be essentially seen as a coarse identification of the working point, performed by making the device converge towards one of the two characteristics that are the closest ones to the optimum operating point. It will be however appreciated that the notation "coarse" given to this phase is not wholly adequate since such a phase may result already in the rapid achievement of the optimum operating condition. Even if this does not occur, the non-optimum character of the convergence condition attained is in all cases marginal, since the achievement of the optimum condition only requires in practice the execution of a step corresponding to the move to an adjacent, very close characteristic (just because of the high density of the family of the allowable operating characteristics: see in this regard FIG. 5).

We will now examine the structure of control module 8, as shown in FIG. 3, where references 30 and 40 are two control units that, by interacting with an additional pre-bias unit 50, allow implementing the adaptation of the operating characteristics of the circuit by performing one after the other the two phases of coarse adjustment (unit 30) and fine adjustment (unit 40), previously described.

The unit 30 is essentially a counter that receives the signal CLKIN (through line 11) as well as the output signal of the oscillator 5 or the divider 7, if any (line 190 of FIG. 1). So the unit 30 will operate on the frequency given by the input signal CLKIN and on a second frequency, which is related in any case to the output frequency of the oscillator 5, since it is either the actual output frequency of the oscillator 5 or a sub-multiple or a multiple thereof, if the divider 7 is present. The counter 30 further has a reset input (at which it receives a signal RESET, see the time diagram of FIG. 6a), and a further input line 31 which conveys the signal PREPOL coming from the unit 50. That signal, the behaviour of which is represented in the time diagram of FIG. 6d, actually represents an enabling signal for the unit 30.

The counter 30 has then two output lines 301 and 302, that transfer towards unit 50 two signals FHIGH and STROBECOARSE, respectively. The first signal identifies, as will be better seen in the sequel, the direction of movement in the exploration by bands of the family of characteristics of FIG. 5. The second signal essentially is a validation signal for the first one.

The unit 40, which is comparable to a certain extent to the whole of the modules 80 and 81 in EP-A 0 915 568, receives at its input the output signal of the filter 4 through lines 210 and 211 (forming in the whole line 21 of FIG. 1). The unit 40 also receives the signal PREPOL present on the line 31, in addition to the signal CLKIN available on the line 11 and to the reset signal RESET.

The output of the unit 40 consists of two additional lines 401 and 402 conveying respective signals UP/DOWN and STROBEFINE to unit 50. The first signal provides the indication relating to the possible displacement towards the immediately upper (UP) or immediately lower (DOWN) characteristic. Also in this case, the second signal represents the validation signal for the first one.

The unit 50 receives the signals arriving over the lines 301, 302, 401, 402, and the reset signal RESET, and generates at its output:
  on the line 20, the control signal towards the oscillator 5,
  on the line 22, a signal LOCKFILTER, sent to the circuit 3 and destined to inhibit the control action of the loop filter 4 on the frequency of the oscillator 5 during the phase of search or exploration by bands of the family of characteristics of FIG. 5, and
  on the line 31, the signal PREPOL.

The diagram of FIG. 4 shows in even greater detail the generation of the signals FHIGH and STROBECOARSE, present on lines 301 and 302, within the unit 30. In particular, in the diagram of FIG. 4, the reference 310 denotes a circuit which implements a time base as a function of the frequency of the signal CLKIN arriving over the line 11. The reference 311 denotes a counter such as, for example, a binary counter, arranged to count up to a value (for instance equal to 256) depending on the accuracy desired for the comparison between the incoming frequencies on the lines 11 and 190. The counter 311 receives at its input the signal present on the line 190 (in practice the frequency of the oscillator 5, divided by the division factor of the divider 7, if any).

The connection between the time base 310 and the counter 311 is performed through two lines 3101 and 3102. The line 3101 carries a periodic enabling signal, whose duration is determined by the accuracy required for the comparison between the two input frequencies of the unit 30. For instance, such duration may be chosen equal to 256 times the period of the signal CLKIN present on the line 11. The line 3102 carries a signal that periodically resets the counter 311 at the end of the enabling window corresponding to the signal present on the line 3101. The signal present on the line 3102 corresponds in practice to the signal STROBECOARSE. The signal FHIGH corresponds instead to the overflow output of the counter 311, which output is caused to pass through a buffer circuit 312, usually formed by a flip-flop.

With reference to FIG. 6, the four time diagrams denoted by a, b, c, and d show the behaviour of the signals RESET, STROBECOARSE, LOCKFILTER and PREPOL, illustrated respectively:

- in the initial phase of "coarse" identification of the operating characteristic (pre-bias phase denoted by A), and
- in the subsequent phase of regular operation, with the enabling of the fine adjustment function, according to the terms better described in the sequel (phase B).

Basically, upon activation, the circuit aims at choosing the best characteristic (the one whose rest position is the closest one to the nominal frequency—determined in practice by the frequency of the signal CLKIN) through a dichotomic mechanism.

In practice the mechanism of choice of the best characteristic is effected by exploring the family of the characteristics shown in FIG. 5 by bands of progressively narrower width. This occurs in particular on the basis of the following criteria, described with reference to the possible presence of 256 characteristics.

Preferably, at the start of the Phase A, the unit 50 acts on the filter 4 through the signal LOCKFILTER so as to inhibit the frequency control of the oscillator 5 by the filter 4 itself. The unit 50 selects the central characteristic in the family of 256 characteristics, in this case the 128th characteristic.

The reference frequency CLKIN is then compared with the frequency present on the line 190 and, depending of the outcome of said comparison, i.e. on the sign of the difference between such frequencies, there is considered the central frequency of one of the two bands into which the family of the operating characteristics represented in FIG. 5 is subdivided by the characteristic that has been selected at that moment (the 128th characteristic in the example).

In practice, if the frequency of the oscillator 5 (divided by divider 7, if any) is greater than the reference frequency (positive sign difference), the central characteristic of the lower band is then considered, and the 64th characteristic is chosen. If instead the frequency of the oscillator 5 is lower than the reference frequency (negative sign difference), then the central characteristic of the upper band, i.e. the 192nd characteristic is taken into account.

At this point the operation is repeated within the band previously chosen. The respective central characteristic— the 192nd or the 64th characteristic—splits the respective band into two sub-bands of which the width is half that considered in the previous choice step. The new frequency of the oscillator 5 is then compared with the reference frequency and depending on the comparison outcome, the circuit passes to the central characteristic of one of the new bands, hence the characteristic which is spaced apart by 32 positions upwards or downwards of the one previously chosen.

The above operation is repeated for n steps (in this case, eight) until the circuit settles on the characteristic whose rest frequency is the closest one to the reference frequency.

It shall be appreciated that the above procedure of search for the operating characteristic has a rapid convergence, since the number of steps is related to the logarithm with base 2 of the number of characteristics.

An embodiment of the method described on the basis of the circuit structure of FIGS. 3 and 4 may be illustrated referring to the time diagrams of FIG. 6.

On the activation or reset of the circuit (RESET signal applied to the units 30, 40 and 50), the signals LOCKFILTER and PREPOL (FIGS. 6c and 6d) become high.

The frequency comparator (blocks 310 and 311) is active and the characteristic selected by the pre-bias circuit 50 is the central one (the 128th in the exemplary embodiment). The action of the control signal coming from the filter 4 is inhibited (by signal LOCKFILTER on the line 22) so that the centre of the characteristics is considered. The frequency comparator start the comparison between the outside reference frequency CLKIN, present on the line 11, and the frequency of the oscillator 5 (divided by the divider 7, if any), detected on the line 190.

In practice, at the end of the enabling interval generated on the line 3101 of the block 310, it is checked whether the counter 311 has reached the overflow condition, which event indicates that the frequency present on the line 190 is higher than the frequency CLKIN present on the line 11. Said event is stored by the flip-flop 312 that originates the signal FHIGH. Said signal is therefore high if the oscillator has a frequency higher than the reference frequency CLKIN, or low if the oscillator has a frequency lower than the reference. This information is sent to the pre-bias circuit 50 by means of a pulse of the signal STROBECOARSE. The unit 50 recognises the outcome of the comparison effected in the unit 30 and starts the subsequent comparison phase in such a way that the new frequency corresponding to the subsequent characteristic to be considered, according to the dichotomic or two-section diagram previously seen arrives on the line 190.

The above operation of comparison and modification of the characteristic used for the comparison is carried out through the n steps previously described.

Once attained the convergence on the characteristic whose rest frequency is less far (in frequency) from the reference, the pre-bias circuit 50 recognises the end of the phase of coarse search (phase A in FIG. 6), and informs the filter 4, by means of the signal LOCKFILTER (FIG. 6c) on the line 22, that it is now possible to unlock the control voltage, thus leaving the device free to evolve to the phase locked function so as to achieve the phase locked condition to the outside reference.

Preferably, the pre-bias circuit 50 additionally inhibits the frequency comparator 30 (through the signal PREPOL) for the purpose of minimising power consumption.

At this point, the unit 30 becomes in practice inactive, whilst the unit 50 operates under the control of the unit 40, in particular according to the signals UP/DOWN and STROBEFINE emitted by unit 40 on the lines 401 and 402.

In practice, the unit 50 acts under the control of the signal STROBEFINE depending on the value of the UP/DOWN signal: the upwards (UP) and the downwards direction (DOWN) are here meant as corresponding to the order according to which the characteristics are shown in the diagram of FIG. 5. The UP value intervenes on the unit 50 so that the oscillator 5 is made to operate on a higher characteristic than the one on which the same oscillator is positioned at that moment. The DOWN value causes an intervention in the opposite direction.

The signal UP/DOWN is generated by the unit 40 which, from this standpoint, may be substantially regarded as a double comparator with hysteresis that, upon realising the need of effecting a change of characteristic, sends, in addition to the signal UP/DOWN, also the relating validation signal STROBEFINE. In this phase the unit 50 acts as a finite state machine which intervenes on the oscillator 5, modifying the characteristic in the indicated direction of the signal UP/DOWN, when the module itself is validated by STROBEFINE.

As an example (for a more complete explanation of these operating modes, reference can be made to the above mentioned EP-A 0 915 568) it might be assumed that the operating point attained at the end of the phase of coarse convergence is such that it causes the oscillator to operate at a frequency lower than the desired one.

The general feedback function of the circuit causes then an increase in the voltage at the input of oscillator 5. The unit 40 emits the signal STROBEFINE while the signal UP/DOWN is high, and the unit 50 starts selecting the immediately higher characteristic. Under such conditions, the operating frequency of the oscillator 5 switches to the value corresponding to the higher characteristic.

The circuit starts then tracking the desired frequency, and moves down backwards along the new characteristic attained, entering again at this point the band of the comparator with hysteresis (i.e. with the control voltage within the pre-set limits) and stabilising at the desired final operating frequency.

The same mechanism of fine adjustment can intervene during the operation to take into account possible variations in the operating conditions. For example, under the hypothesis that the optimum characteristic has been reached in the initial phase, it may happen that in steady state operating conditions the device temperature increases and such increase causes a downwards shift of all operating characteristics of the oscillator. In such a case the circuit detects this event (i.e. the circuit detects that the control voltage approaches the end of the range) and causes the switching (upwards, in this case) by one characteristic. After waiting for the circuit reaching again its steady state operating conditions, a check is made on whether the switching has been sufficient to restore the system to its correct operating conditions; in the negative a new switching is effected. This happens until the operating point of the device reaches a position very close to the centre of the characteristic.

Of course, when the change in the operating conditions is substantial, for instance for the need of making the circuit operate at a new frequency, it is preferable to reset the circuit and to activate again the convergence process towards the desired operating condition through the phase of "coarse" convergence, previously illustrated.

Obviously, while the principle of the invention remains unchanged, the construction details and the embodiments may be widely varied with respect to what is described and illustrated herein, without thereby departing from the scope of the present invention, as defined in the claims attached hereto.

What is claimed is:

1. Phase locked loop circuit (1), comprising:
   a comparator (2) arranged to generate a deviation signal starting from an input signal (CLKIN) of a given frequency and from a feedback signal (FBCLK),
   an oscillator (5) arranged to generate, starting from at least one driving signal derived from said deviation signal, an output signal (CLKOUT) of respective given frequency locked with said input signal (CLKIN); said oscillator being arranged to operate according to a plurality of characteristics belonging to a family of characteristics that relate said driving signal to said output signal, and
   control means (8) arranged to originate said family of characteristics and to automatically control the operation of said oscillator (5) according to an operating characteristic that has been selectively determined among the characteristics of said family,
   characterised in that said control means (8) comprise means (30, 50) for searching in successive steps said operating characteristic by exploring said family of characteristics by bands of progressively reduced width.

2. Circuit according to claim 1, characterised in that said searching means (30, 50) are responsive to the sign of the difference between the frequency of said input signal (CLKIN) and a second frequency related to the frequency of said output signal (CLKOUT), and in that said successive search steps comprise at least one step in which the subsequent search band is selected by said searching means depending on the sign of said difference.

3. Circuit according to claim 1, characterised in that said bands of progressively reduced width are respective sub-bands of the previous bands.

4. Circuit according to claim 2, characterised in that said searching means (30, 50) are arranged to carry out said at least one search step while said oscillator (5) operates according to a reference characteristic situated in a generically intermediate position within the explored characteristics, so as to define respective subsequent exploration bands, located above and below said reference characteristic, respectively.

5. Circuit according to claim 4, characterised in that said searching means (30, 50) are arranged to define, as a subsequent exploration band, respectively the band situated above said reference characteristic when said difference has a negative sign, and the band situated below said reference characteristic when said difference has a positive sign.

6. Circuit according to claim 1, characterised in that said searching means (30, 50) are arranged to define, in said at least one step, the subsequent exploration band as a partition of the previous exploration band according to a general dichotomic process.

7. Circuit according to claim 6, characterised in that said partition is a partition in half, so that said searching means (30, 50) are arranged to carry out a number of subsequent search steps related with the logarithm with base 2 of the number of characteristics belonging to that family.

8. Circuit according to claim 1, characterised in that said searching means (30, 50) comprise frequency comparator means (30) arranged to compare said given frequency and said second frequency; said frequency comparator means (30) substantially comprising two counters (310, 311), driven by one and the other frequencies, being compared, respectively.

9. Circuit according to claim 1, characterised in that said control means (8) comprise, in addition to said searching means (30, 50), further means 40, 50) for the fine search (of the operating characteristic of said oscillator (5); said fine search means (40, 50) being operable after said search by steps has been carried out by said searching means (30, 50), to control the selective switching of the oscillator (5) from one of the characteristics of said family to at least one adjacent characteristic.

10. Circuit according to claim 1, characterised in that said searching means (30, 50) comprise means (50, 22) for selectively inhibiting the action of said deviation signal on said oscillator (5), so that the above search by steps is carried out while said second frequency is substantially not affected by said deviation signal.

11. Circuit according to claim 10, characterised in that it comprises a loop filter (4) fed with said deviation signal, in that said oscillator (5) generates said output signal (CLKOUT) starting from at least one driving signal derived from said deviation signal filtered by said loop filter (4), and in that said searching means (30, 50) act on said loop filter (4) by inhibiting its operation during said exploration by bands of said family of characteristics.

12. Circuit according to claim 1, characterised in that said oscillator (5) is a voltage-controlled oscillator (VCO) and in that said plurality of characteristics comprises characteristics that relate the frequency of said output signal (CLKOUT) to the value of said at least one driving signal.

* * * * *